US006674278B1

(12) United States Patent
Uesugi

(10) Patent No.: US 6,674,278 B1
(45) Date of Patent: Jan. 6, 2004

(54) AC CURRENT DETECTION DEVICE

(75) Inventor: Michika Uesugi, Fuji (JP)

(73) Assignee: Toshiba Carrier Corporation, Tokyo-To (JP)

( * ) Notice: Subject to any disclaimer, the term of this patent is extended or adjusted under 35 U.S.C. 154(b) by 0 days.

(21) Appl. No.: 10/030,539

(22) PCT Filed: Jan. 13, 2000

(86) PCT No.: PCT/JP00/04706
§ 371 (c)(1),
(2), (4) Date: Jan. 11, 2002

(87) PCT Pub. No.: WO01/06266
PCT Pub. Date: Jan. 25, 2001

(30) Foreign Application Priority Data

Jul. 15, 1999 (JP) ............................................. 11-202076

(51) Int. Cl.$^7$ ............................................... G01R 33/00
(52) U.S. Cl. ..................................... 324/127; 324/117 R
(58) Field of Search ................................ 324/126–127, 324/117 R, 117 H, 142, 654, 158.1; 323/356–358; 336/145–147, 170

(56) References Cited

U.S. PATENT DOCUMENTS

| 4,054,829 A | * | 10/1977 | Searle | 323/356 |
| 4,309,652 A | * | 1/1982 | Ito et al. | 323/357 |
| 5,369,355 A | * | 11/1994 | Roe | 323/356 |
| 5,568,047 A | * | 10/1996 | Staver et al. | 324/127 |

FOREIGN PATENT DOCUMENTS

| JP | 3-46870 | 4/1991 |
| JP | 9-171935 | 6/1997 |
| JP | WO 01/06266 | 1/2001 |

OTHER PUBLICATIONS

English translation of International Preliminary Examination Report.

* cited by examiner

Primary Examiner—Kamand Cuneo
Assistant Examiner—Minh N. Tang
(74) Attorney, Agent, or Firm—Pillsbury Winthrop LLP

(57) ABSTRACT

An alternating current detector includes a current transformer having a primary winding through which a current to be detected flows, and a secondary winding and an auxiliary winding, magnetically coupled to the primary winding via a core, of which one ends are connected to each other and thus form a common terminal, and an operational amplifier for amplifying a voltage induced in the auxiliary winding, and applying the voltage to the secondary winding with the current assuming such a polarity as to restrain a change in magnetic flux of the core, whereby a voltage corresponding to the current to be detected is induced in the secondary winding. A waveform of a large current having a low frequency can be thereby observed highly precisely with an output of the detected voltage having a large amplitude.

2 Claims, 4 Drawing Sheets

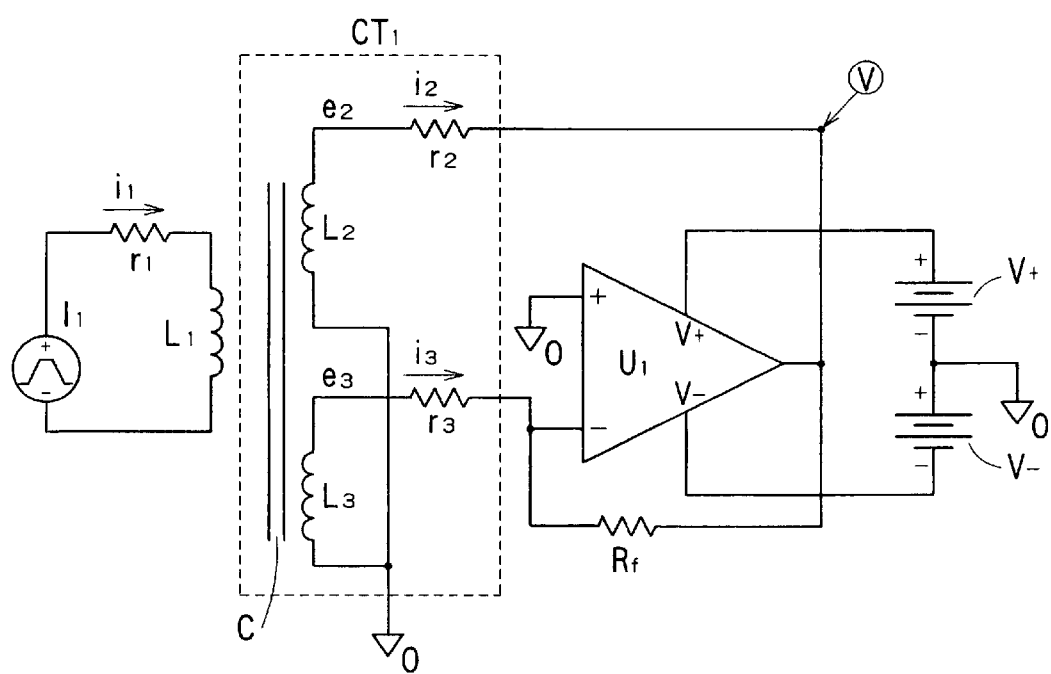
F I G. 1

AC CURRENT DETECTION DEVICE

BACKGROUND OF THE INVENTION

This application is the National Phase of International Application PCT/JP00/04706 filed Jul. 13, 2000 which designated the U.S. and that International Application was published under PCT Article 21(2) in English.

1. Field of the Invention

The present invention relates to an alternating current detector suitable for detecting an alternating current having a large amplitude and a low frequency.

2. Related Background Art

In vector control for an AC motor, it is required that an alternating current be converted into an AC voltage and there be obtained a voltage waveform with a less phase delay than a current waveform. The conversion of the alternating current into the AC voltage involves the use of a current transformer generally known as CT and of a Hall CT making use of the Hall effect. Of these components the Hall CT is expensive and limited in its application, and therefore the current transformer will hereinafter be described.

FIG. 5 is a circuit diagram for explaining a principle of the current transformer (CT). Referring to FIG. 5, a conductor connected to a detection current source $I_1$ constitutes a one-turn primary winding $L_1$ of the current transformer. A resistance of this conductor is set as a primary winding resistance $r_1$, and these components are connected in series, thereby forming a primary circuit. Further, the current transformer has a secondary winding $L_2$ magnetically coupled to the primary winding $L_1$ via a core C. A resistance of the secondary winding $L_2$ is set as a secondary winding resistance $r_2$, and these components are connected in series, thereby forming a secondary winding circuit of the CT. A voltage detection resistance R is connected to an output terminal of this CT secondary winding circuit, thereby forming a secondary circuit.

Herein, let 1 [T] be the number of turns of the primary winding $L_1$, $n_2$ [T] be the number of turns of the secondary winding $L_2$, $i_1$ be a current of the primary winding $L_1$ which flows in an arrowhead direction, $i_2$ be a current of the secondary winding $L_2$, and, with one end, i.e., the lower end in the Figure, of the voltage detection resistance R being set as a reference potential terminal, V be a voltage at the other end, i.e., the upper end in the Figure, of the voltage detection resistance R as viewed from this reference potential terminal, and a relation in the following formula is established between these parameters.

$$i_1 = n_2 \cdot i_2 \quad (1)$$

Further, supposing that a secondary winding resistance $r_2$ is set to zero (0), the voltage v is not induced, and hence a time change of the secondary winding current $i_2$ becomes zero as shown in the following formula.

$$\frac{di_2}{dt} = 0 \quad (2)$$

Accordingly, as shown in the following formula, the secondary winding current $i_2$ is kept constant.

$$i_2 = \frac{i_1}{n_2} \quad (3)$$

In the actual CT, however, there exist the secondary winding resistance $r_2$ and the voltage detection resistance R also called a shunt resistance, and an electromotive force $e_2$ given by the following formula occurs at both ends of the secondary winding $n_2$.

$$e_2 = (r_2 + R) \cdot \frac{i_1}{n_2} \quad (4)$$

This secondary winding resistance $r_2$ and the voltage detection resistance R are factors for the time change of the secondary winding current $i_2$.

Now, let $L_2$ be an inductance of the secondary winding $L_2$, and a time change rate of the secondary winding current is expressed by the following formula:

$$\frac{di_2}{dt} = \frac{e_2}{L_2} = \frac{1}{L_2} \cdot (r_2 + R) \cdot \frac{i_1}{n_2} \quad (5)$$

Hence, the relation in the formula (3) which has been established immediately after the electrification is lost, and the magnetic flux Φ occurs in the core C.

In the conventional alternating current detector based on the CT, even when the primary current $i_1$ is fixed, the secondary winding current $i_2$ attenuates with an elapse of time, and the magnetic flux Φ occurs in the core C. Hence, there arises a problem, in which an error comes out when converting the detection voltage waveform into the current waveform, and, even if the detection voltage is in the vicinity of zero, the electromotive force for the winding resistance is not zero, or the core is easy to saturate in the large current having a low frequency.

SUMMARY OF THE INVENTION

It is a primary object of the present invention, which was devised to solve the problems described above, to provide an alternating current detector capable of highly precisely observing a waveform of a large current having a low frequency with an output of a voltage having a high amplitude.

To accomplish the above object, according to one aspect of the present invention, an alternating current detector comprises a current transformer having a primary winding through which a current to be detected flows, and a secondary winding and an auxiliary winding, magnetically coupled to the primary winding via a core, of which one ends are connected to each other and thus form a common terminal, and an operational amplifier for amplifying a voltage induced in the auxiliary winding, and applying the voltage to the secondary winding with the current assuming such a polarity as to restrain a change in magnetic flux of the core, whereby a voltage corresponding to the current to be detected is induced in the secondary winding.

According to another aspect of the present invention, an alternating current detector comprises a current transformer having a primary winding through which a current to be detected flows, and a secondary winding magnetically coupled to the primary winding via a core, a common terminal constructed of a middle tap provided in the secondary winding, and an operational amplifier, having one winding set as a main winding and the other winding set as an auxiliary winding with the common terminal being the boundary, for amplifying a voltage induced in the auxiliary winding, and applying the amplified voltage to the main winding with the current assuming such a polarity as to restrain a change in magnetic flux of the core, whereby a voltage corresponding to the current to be detected is induced in the main winding.

The common terminal may be connected to a reference potential terminal of the operational amplifier.

The alternating current detector may further comprise a current data reading system for reading the voltage corresponding to the current to be detected. A reference potential of the operational amplifier may be set as an intermediate potential of a voltage of a power source of the current data reading system.

BRIEF DESCRIPTION OF THE DRAWINGS

FIG. 1 is a circuit diagram showing a first embodiment of an alternating current detector according to the present invention;

DESCRIPTION OF THE PREFERRED EMBODIMENTS

Figure 2A:
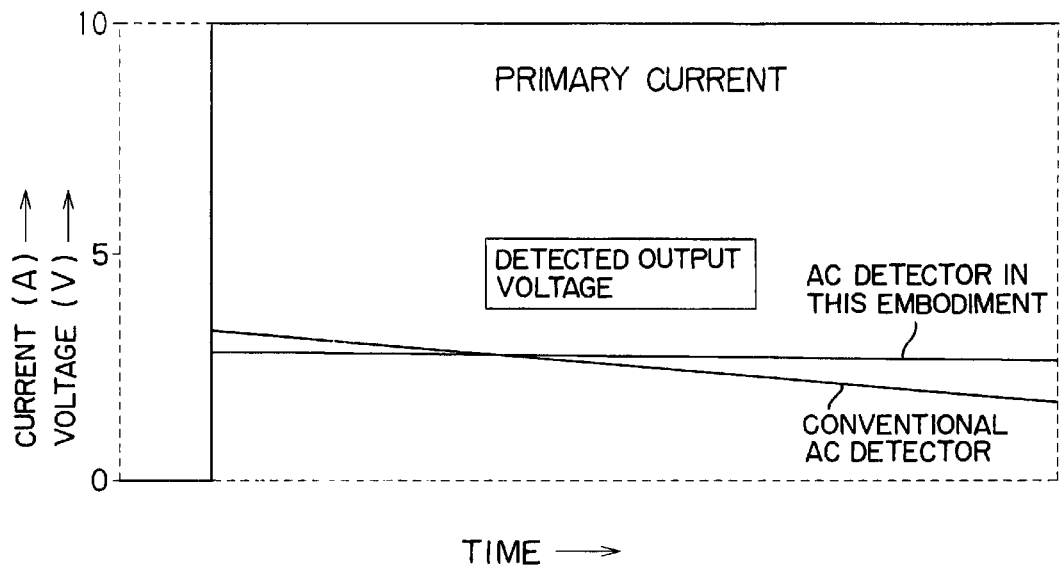
FIGS. 2A and 2B are graphs showing a state of how a detected output voltage changes immediately after a direct has flowed stepwise to a primary winding, and a state of how a magnetic flux of a core changes in a comparison between by the AC detector in this embodiment and by a prior art detector.

Preferred embodiments of the present invention will hereinafter be described in depth with reference to the accompanying drawings.

FIG. 1 is a circuit diagram showing a first embodiment of an alternating current detector according to the present invention. Referring to FIG. 1, the same components as those shown in FIG. 5 in the prior art detector are marked with the like numerals. The AC detector in the first embodiment is constructed of a current transformer $CT_1$ including a secondary winding $L_2$ and an auxiliary winding $L_3$ which are magnetically coupled via a core C to a primary winding $L_1$, and an operational amplifier U1 for amplifying a voltage induced in the auxiliary winding $L_3$ and applying the amplified voltage to the secondary winding $L_2$ with the current assuming a polarity of restraining a change in magnetic flux of the core C.

Herein, one ends of the secondary winding $L_2$ and of the auxiliary winding $L_3$ are connected to each other and further connected to a non-inverting input terminal (+) of the operational amplifier $U_1$, i.e., to a reference potential terminal. The other end of the secondary winding $L_2$ is connected to an output terminal of the operational amplifier $U_1$, and the other end of the auxiliary winding $L_3$ is connected to an inverting input terminal (−) of the operational amplifier $U_1$. Further, a feedback resistance $R_f(>>r_3)$ is connected to between the output terminal and the inverting input terminal of the operational amplifier U1. Moreover, a DC power source V+ and a DC power source V− are connected in series as a drive power source of the operational amplifier $U_1$. A positive pole of the DC power source V+ and a negative pole of the DC power source V− are connected to positive/negative power source terminals of the operational amplifier $U_1$. Note that a mutual source V− is connected to the non-inverting input terminal of the operational amplifier U1 and held at an intermediate potential of a power source voltage of an unillustrated current data reading system.

An operation of this embodiment having the construction described above will be explained.

Let $r_3$ be the winding resistance of the auxiliary winding L3, and an amplification rate A of the operational amplifier $U_1$ is given by $R_f/r_3$. Herein, it is presumed that a current $i_1$[A] flows through the primary winding $L_1$, an electromotive force $e_2$ is induced in the secondary winding $L_2$, and an induction voltage $e_3$ is induced in the auxiliary winding $L_3$. In this case, a relation in the following formula (6) is established between the induced voltage $e_3$ of the auxiliary winding $L_3$ and the induced voltage $e_2$ of the secondary winding $L_2$.

$$e_3 = \frac{n_3}{n_2} \cdot e_2 \tag{6}$$

Let v be an output voltage of the operational amplifier $U_1$ as viewed from the reference potential terminal, and this output voltage v is expressed by the following formula (7).

$$V = -A \cdot \frac{n_3}{n_2} \cdot e_2 \tag{7}$$

As a result, a current $i_2$ shown in the following formula (8) flows via the secondary winding resistance $r_2$ to the secondary winding $L_2$.

$$i_2 = \frac{e_2}{r_2} + A \cdot \frac{n_3}{n_2} \cdot \frac{e_2}{r_2} \tag{8}$$
$$= \left(1 + A \cdot \frac{n_3}{n_2}\right) \cdot \frac{e_2}{r_2}$$

Accordingly, a current $i_3$ shown in the following formula (9) flows to the auxiliary winding $L_3$.

$$i_3 = \frac{n_3}{n_2} \cdot \frac{e_2}{r_3} \tag{9}$$

Immediately after supplying the primary current, a magnetic flux Φ of the core C is zero, and hence the current $i_1$ of the primary winding takes a value given by the following formula (10).

$$i_1 = n_2 \cdot i_2 + n_3 \cdot i_3 \tag{10}$$
$$= n_2 \cdot \left(1 + A \cdot \frac{n_3}{n_2}\right) \cdot \frac{e_2}{r_2} + n_3 \cdot \frac{n_3}{n_2} \cdot \frac{e_2}{r_3}$$

Figure 5:
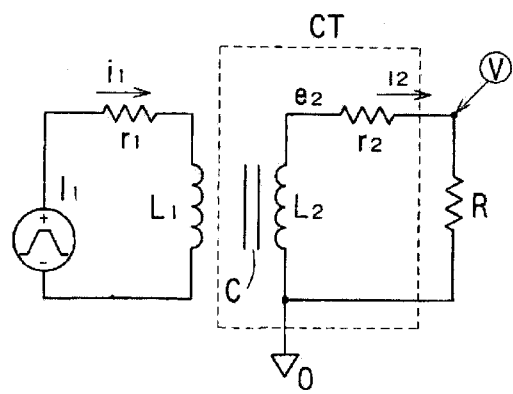
FIG. 5 is a circuit diagram showing a construction of a current transformer as a prior art AC detector.

The formula (10) is transformed, and the voltage $e_2$ is obtained by the following formula (11):

Incidentally, the secondary winding voltage of the prior art detector shown in FIG. 5 is given by:

Incidentally, the secondary winding voltage of the prior art detector shown in FIG. 5 is given by:

$$e_2 = (r_2 + R) \cdot \frac{n_1}{n_2} \quad (12)$$

In a comparison between the formula (11) and the formula (12), the induction voltage $e_2$ shown in the formula (12) is fixed, while the induction voltage e2 shown in the formula (11) can be restrained very small by sufficiently increasing the amplification rate A of the operational amplifier $U_1$.

Further, the output voltage v of the operational amplifier $U_1$ can be expressed by the following formula (13) in combination with the formulae (7) and (11).

$$v = -A \cdot \frac{n_3}{n_2} \cdot \frac{i_1 \cdot \frac{r_2}{n_2}}{\left(1 + A \cdot \frac{n_3}{n_2}\right) + \frac{r_2}{r_3} \cdot \left(\frac{n_3}{n_2}\right)^2}$$

$$= -i_1 \cdot \frac{n_3 \cdot r_2}{n_2 \cdot n_3 + \frac{(n_2)^2}{A} + \frac{\frac{r_2}{r_3} \cdot (n_3)^2}{A}} \quad (13)$$

It can be understood from this formula (13) that the output voltage v of the operational amplifier can be used intact as a conversion voltage output proportional to the primary winding current $i_1$. Further, if the amplification rate A approximates the infinity, the induction voltage $e_2$ of the secondary winding becomes as close as zero, and the output voltage v of the operational amplifier converges on a value given by the following formula (14).

$$v = -i_1 \cdot \frac{r_2}{n_2} \quad (14)$$

The value given by the formula (14) implies that the electromotive force based on the internal resistance $r_2$ of the secondary winding which occurs in the conventional detector, is compensated by the electric power supplied from outside.

Figure 2B:
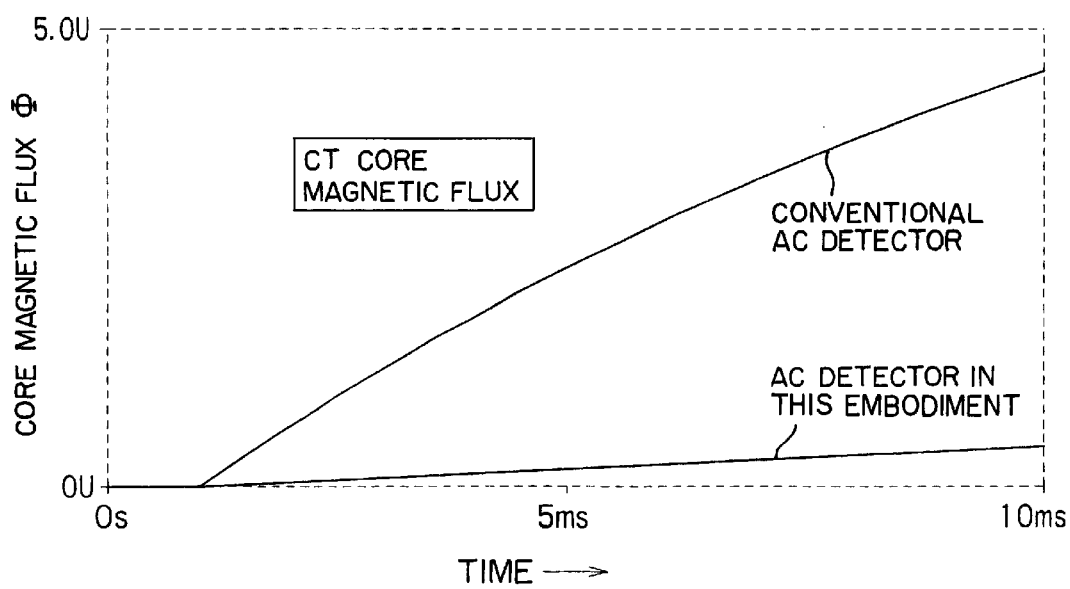

FIG. 2A is a graph showing a state of how the detected output voltage changes immediately after the direct current of 10[A] has flowed stepwise to the primary winding L1 in a comparison between the AC detector in this embodiment and the prior art detector. FIG. 2B is a graph showing a state of how the magnetic flux Φ of the core changes in that case in a comparison between by the AC detector in this embodiment and by the prior art detector. As obvious from these graphs, an attenuation of the detected output voltage increasing logarithmically with an elapse of time can be restrained down to a slight level in this embodiment as compared with the prior art detector. Further, the increase in the core magnetic flux Φ can be restrained extremely small.

Figure 3A:
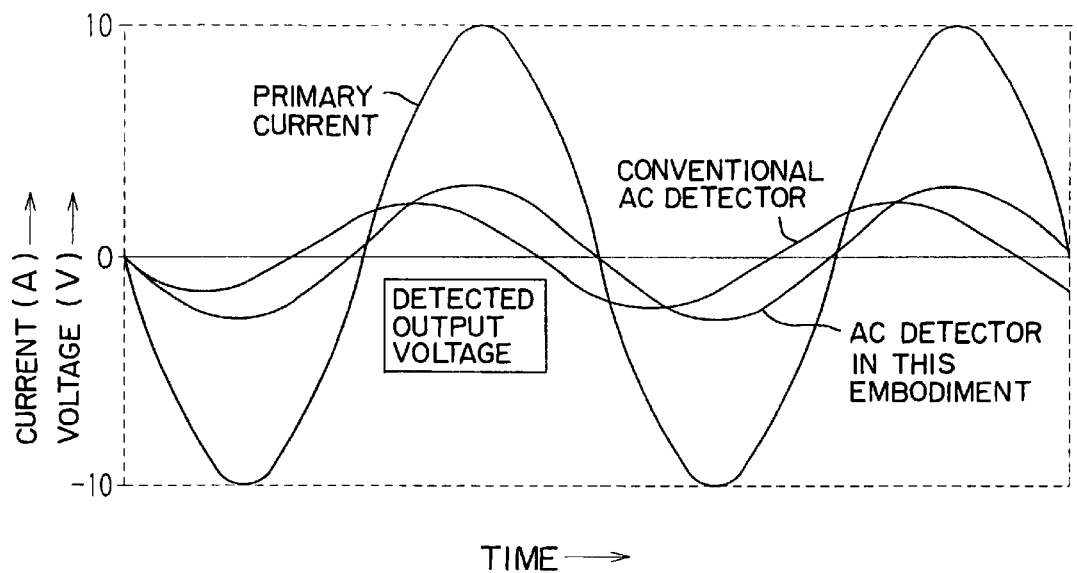
FIGS. 3A and 3B are graphs showing a state where the detected output voltage changes and a state where the core magnetic flux changes when a sine wave alternating current having a low frequency flows through the primary winding.
Figure 3B:
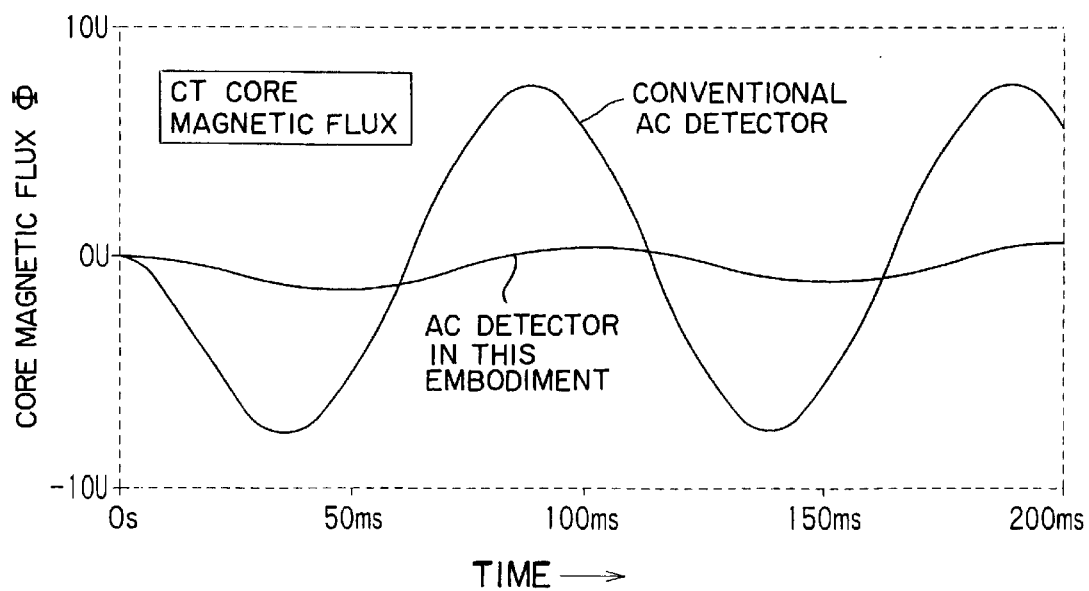

FIG. 3A is a graph showing a state where the detected output voltage changes when a sine wave alternating current, of which an amplitude is 10 [A] and a frequency is 10 [Hz], flows through the primary winding $L_1$ in the comparison between by the AC detector in this embodiment and by the prior art detector. FIG. 3B is a graph showing a state of how the magnetic flux Φ of the core changes in that case in the comparison between by the AC detector in this embodiment and by the prior art detector. As apparent from these graphs, in accordance with this embodiment, as compared with the prior art detector, the detected output voltage assuming substantially an equal phase to that of the primary winding current is obtained, and an increase in the magnetic flux Φ can be restrained small to a remarkable degree.

Thus, according to this embodiment, the attenuation of the secondary winding current with the passage of time can be restrained small, and the increase in the core magnetic flux can also be restrained small. The waveform of the large current having the low frequency can be observed highly precisely with the output of the detected voltage having the large amplitude.

Figure 4:
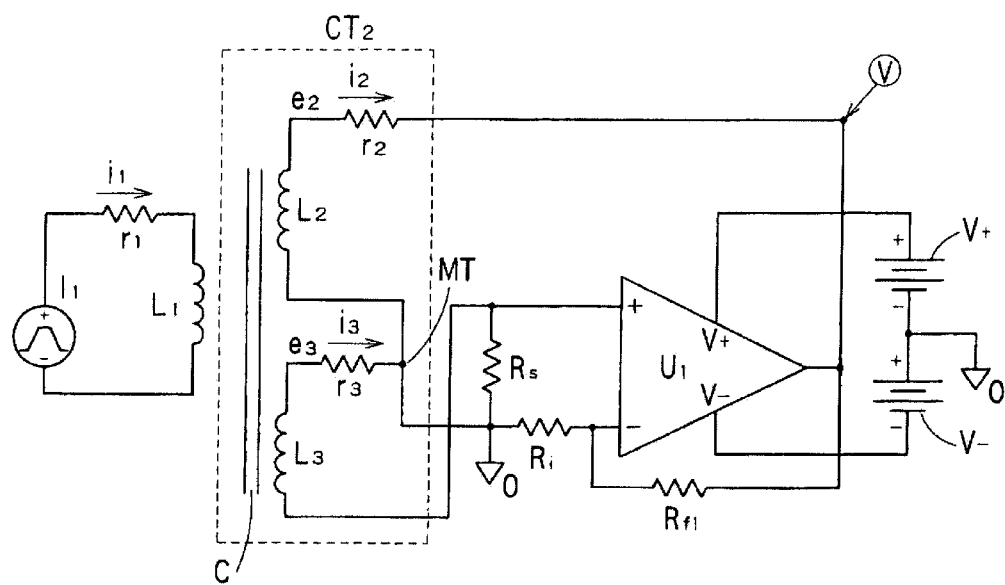
FIG. 4 is a circuit diagram showing a second embodiment of the AC detector according to the present invention.

FIG. 4 is a circuit diagram showing a construction of the current detector in a second embodiment of the present invention. Referring to FIG. 4, the components having the same functions as those in the first embodiment are marked with the like numerals, of which the repetitive explanations are herein omitted. In the second embodiment, the secondary windings magnetically coupled via the core C to the primary winding $L_1$ is provided with a middle tap MT serving as a common. As viewed from this middle tap MT, one winding is set as a main winding $L_2$, while the other winding is set as an auxiliary winding $L_3$. The main winding $L_2$ of these windings is given a function of the secondary winding $L_2$ described above.

Note that, in that case, the middle tap MT is held at the reference potential, a resistance Rs is connected to between the middle tap MT and a terminal of the auxiliary winding $L_3$, the middle tap MT is connected to the inverting input terminal of the operational amplifier $U_1$ through the resistance $R_i$, and the terminal of the auxiliary winding $L_3$ is connected to the non-inverting input terminal of the operational amplifier $U_1$ in order to generate the voltage with the same polarity.

On the other hand, for generating the same voltage as in the first embodiment at the output terminal of the operational amplifier $U_1$, a value of a feedback resistance $R_{fl}$ connected to between the inverting input terminal and the output terminal is set to obtain the amplification rate A (=$R_{fl}/R_i$) explained in the first embodiment.

In the second embodiment, the voltage corresponding to the voltage induced at both ends of the auxiliary winding $L_3$, is generated at both terminals of the resistance Rs. This voltage is amplified, there generating the voltage v having the same polarity and magnitude as those explained in the first embodiment.

Thus, in accordance with the second embodiment illustrated in FIG. 4, the attenuation of the secondary winding current with the elapse of time can be also restrained small, and the increase in the core magnetic flux can be likewise restrained small. Besides, the waveform of the large current having the low frequency can be observed highly precisely with the output of the detected voltage having the large amplitude.

What is claimed is:

1. An alternating current detector comprising:
 a current transformer having a primary winding through which a current to be detected flows, and a secondary winding and an auxiliary winding, magnetically coupled to said primary winding via a core, one end of each of said primary, secondary and auxiliary windings being connected to each other and thus form a common terminal;
 an operational amplifier for amplifying a voltage induced in said auxiliary winding, and applying the voltage to said secondary winding to pass a current through said secondary winding, said current having such a polarity as to restrain a change in magnetic flux of said core; and a current data reading system for reading the voltage corresponding to the current to be detected, wherein a reference potential of said operational amplifier is set as an intermediate potential of a voltage of a power source of said current data reading system, whereby a voltage corresponding to the current to be detected is induced in said secondary winding.

2. An alternating current detector comprising:

a current transformer having a primary winding through which a current to be detected flows, and a secondary winding magnetically coupled to said primary winding via a core;

a common terminal constructed of a middle tap provided in said secondary winding; wherein said secondary winding having one winding set as a main winding and the other winding set as an auxiliary winding with said common terminal being the boundary;

an operational amplifier, for amplifying a voltage induced in said auxiliary winding, and applying the amplified voltage to said main winding to pass a current through said main winding, said current having such a polarity as to restrain a change in magnetic flux of said core; and a current data reading system for reading the voltage corresponding to the current to be detected, wherein a reference potential of said operational amplifier is set as an intermediate potential of a voltage of a power source of said current data reading system, whereby a voltage corresponding to the current to be detected is induced in said main winding.

* * * * *

UNITED STATES PATENT AND TRADEMARK OFFICE
CERTIFICATE OF CORRECTION

PATENT NO.    : 6,674,278 B1
DATED         : January 6, 2004
INVENTOR(S)   : Michika Uesugi Page 1 of 1

It is certified that error appears in the above-identified patent and that said Letters Patent is hereby corrected as shown below:

<u>Title page,</u>
Item [22], PCT Filed, replace "Jan. 13, 2000" with -- Jul. 13. 2000 --.

Signed and Sealed this

Sixth Day of July, 2004

JON W. DUDAS
*Acting Director of the United States Patent and Trademark Office*